US009362443B2

(12) United States Patent
Chiu et al.

(10) Patent No.: US 9,362,443 B2
(45) Date of Patent: Jun. 7, 2016

(54) SOLAR CELL WITH ABSORBER LAYER WITH THREE DIMENSIONAL PROJECTIONS FOR ENERGY HARVESTING, AND METHOD FOR FORMING THE SAME

(71) Applicant: WaferTech, LLC, Camas, WA (US)

(72) Inventors: Re-Long Chiu, Vancouver, WA (US); Shu-Lan Ying, Camas, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 13/801,693

(22) Filed: Mar. 13, 2013

(65) Prior Publication Data
US 2014/0261655 A1 Sep. 18, 2014

(51) Int. Cl.
*H01L 31/0352* (2006.01)
*H01L 31/18* (2006.01)
*H01L 31/068* (2012.01)

(52) U.S. Cl.
CPC .... *H01L 31/1804* (2013.01); *H01L 31/035227* (2013.01); *H01L 31/068* (2013.01); *Y02E 10/547* (2013.01); *Y02P 70/521* (2015.11)

(58) Field of Classification Search
CPC . H01L 31/00; H01L 31/0232; H01L 31/0236; H01L 31/02363; H01L 31/0322; H01L 31/0522; H01L 31/0525; H01L 31/03923; H01L 31/02366; H01L 31/18; H01L 31/02; H01L 31/0248; H01L 31/028; H01L 31/0352; H01L 31/035227; H01L 31/04; H01L 31/042; H01L 31/1804; H01L 31/035272; H01L 31/035281; H01L 31/03529; H01L 31/182; H01L 31/1892
See application file for complete search history.

(56) References Cited

U.S. PATENT DOCUMENTS

| | | | |
|---|---|---|---|
| 3,978,333 A | 8/1976 | Crisman et al. | |
| 4,781,766 A | 11/1988 | Barnett et al. | |
| 5,221,854 A | 6/1993 | Banerjee et al. | |
| 6,229,084 B1 | 5/2001 | Katsu | |
| 6,277,667 B1 | 8/2001 | Huang et al. | |
| 6,692,985 B2 | 2/2004 | Huang et al. | |
| 2002/0172820 A1* | 11/2002 | Majumdar et al. | 428/357 |
| 2004/0187917 A1* | 9/2004 | Pichler | 136/263 |
| 2006/0207647 A1* | 9/2006 | Tsakalakos et al. | 136/256 |
| 2008/0176030 A1* | 7/2008 | Fonash | B82Y 20/00 428/119 |
| 2009/0050204 A1* | 2/2009 | Habib | 136/261 |
| 2009/0217971 A1* | 9/2009 | Guha et al. | 136/255 |
| 2009/0295257 A1* | 12/2009 | Wang et al. | 310/367 |
| 2010/0243020 A1* | 9/2010 | Norton et al. | 136/244 |
| 2013/0143124 A1* | 6/2013 | Lee | H01M 4/13 429/223 |
| 2013/0340824 A1* | 12/2013 | Oh et al. | 136/256 |

OTHER PUBLICATIONS

Definition of "nodule" from the Free Dictionary retrieved from http://www.thefreedictionary.com/nodule on Mar. 26, 2015.*

* cited by examiner

*Primary Examiner* — Christina Chern
(74) *Attorney, Agent, or Firm* — Duane Morris LLP

(57) ABSTRACT

A solar cell with an absorber layer including three dimensional tubular projections and the method for forming the same, is provided. The three dimensional tubular projections are formed in various configurations and include surfaces facing in various directions and are adapted to absorb sunlight directed to the solar cell panel at various angles. The method for forming the absorber layer includes introducing impurities onto a layer over a solar cell substrate to form as nucleation sites and depositing an absorber layer to form a base layer portion and tubular projections at the nucleation sites. The solar cell is exposed to sunlight and the absorber layer including the three dimensional tubular projections, absorbs direct and reflected sunlight directed to the solar cell at various angles.

23 Claims, 4 Drawing Sheets

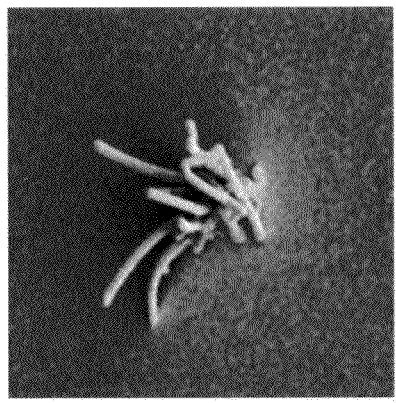
Fig. 6A
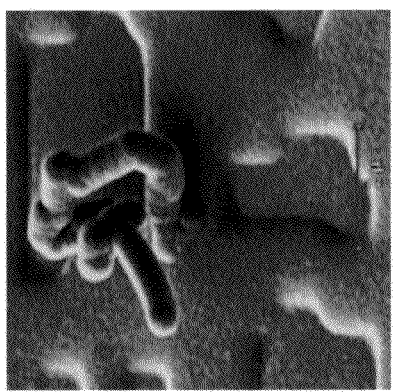
Fig 6B
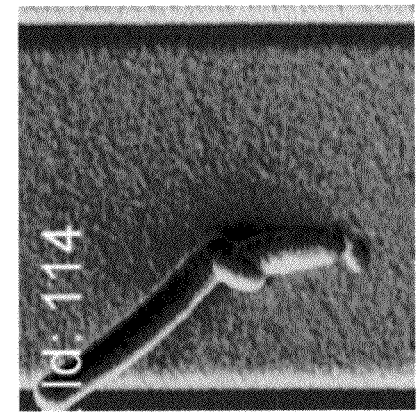
Fig. 6C
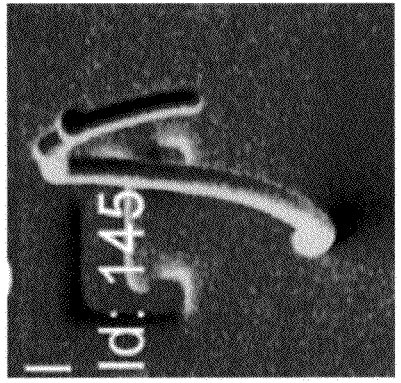
Fig. 6D
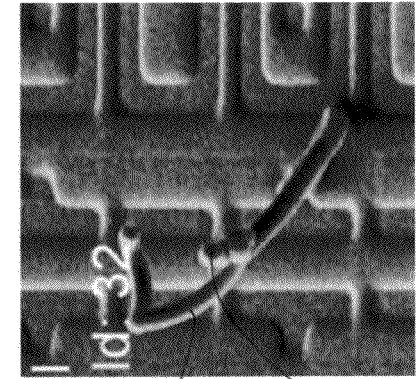
Fig. 6E
Fig. 6F

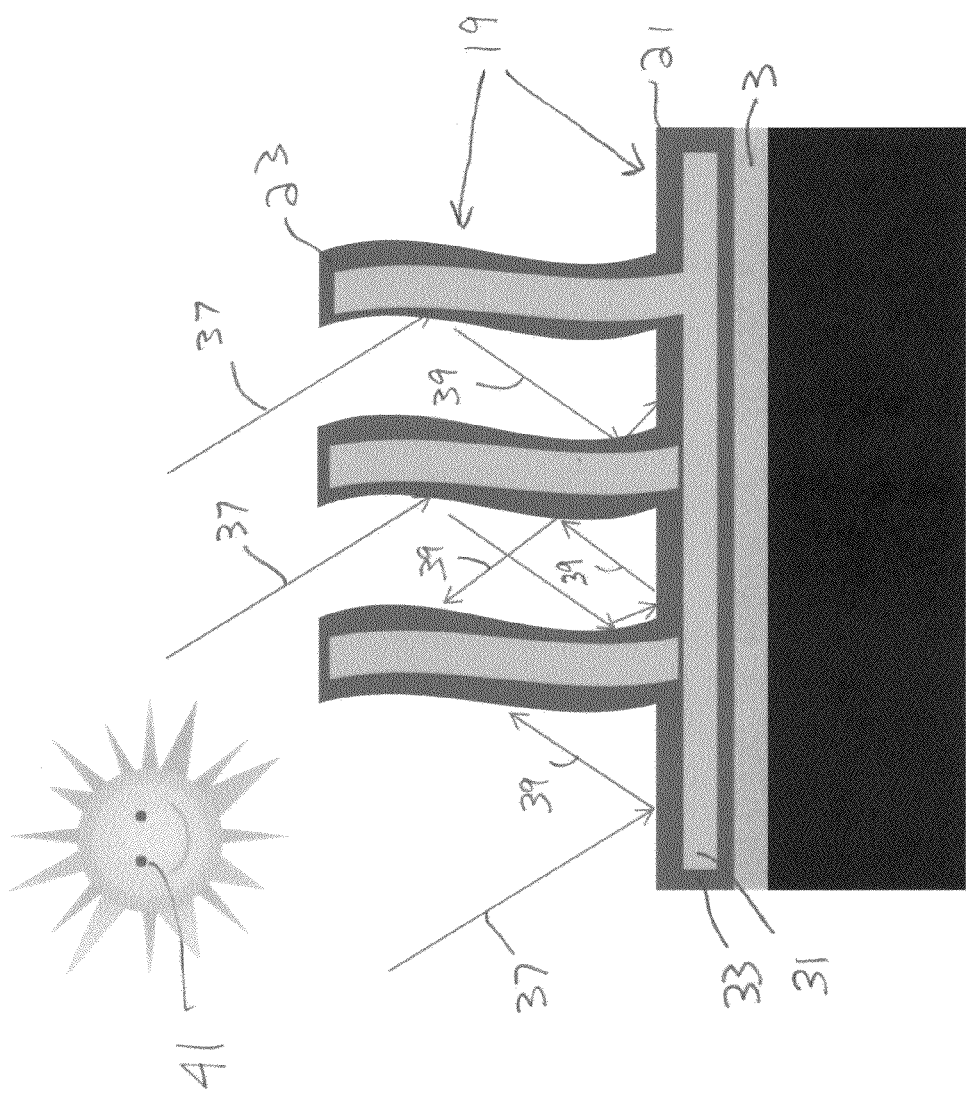

SOLAR CELL WITH ABSORBER LAYER WITH THREE DIMENSIONAL PROJECTIONS FOR ENERGY HARVESTING, AND METHOD FOR FORMING THE SAME

TECHNICAL FIELD

The disclosure relates to solar cells with improved absorber layers, methods and systems for forming absorber layers in solar cells, and methods for using such solar cells to harvest energy from sunlight.

BACKGROUND

Solar cells are photovoltaic components for direct generation of electrical current from sunlight. Due to the growing demand for clean sources of energy, the manufacture of solar cells has expanded dramatically in recent years and continues to expand. Various types of solar cells exist and continue to be developed. Solar cells include absorber layers that absorb the sunlight that is converted into electrical current. The absorber layer is the layer in which photons from sunlight become converted to electrical current. The ability of the solar cells to absorb sunlight and convert it to electrical energy is of critical importance. Thus, the quality and performance of the absorber layer are therefore of paramount importance. The composition of the absorber layer and the structure of the absorber layer are of critical importance in order to maximize the efficiency of electrical current production. The formation of the absorber layer and its placement on the solar cell substrate are therefore also critical operations.

Various types of absorber materials are used in various solar cells. Silicon is one particularly popular type of absorber material. Solar cell absorber materials formed of other materials, for example CIGS, copper indium gallium selenide, are also used. For a solar cell having a particular two-dimensional area, it would be most advantageous to absorb as much sunlight as possible. Solar cells have flat surfaces and include absorbing panels with flat surfaces. The sunlight absorbed by the solar cell is generally limited to sunlight that impinges upon the solar cell surface at an angle generally perpendicular to the panel surface. When the sunlight is at oblique angles to the panel surface, light is reflected and not absorbed. This results in poor efficiency in energy harvesting. In typical solar cells that have two dimensional, i.e. flat absorber layers, this light reflection results in a poor efficiency of converting all available photons to electrons and represents a loss in potential energy harvesting. During winter months or morning or evening hours when sunlight is not directly above and not orthogonal to the surface of the solar plate, the inefficiency in energy harvesting is particularly troublesome. In many cases, approximately thirty percent of incident sunlight is reflected off of the surface of the solar cells.

It would be desirable to produce and utilize an absorber layer that absorbs sunlight from various incident angles.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIG. 1 shows openings formed in a sacrificial material layer;

FIG. 2 shows doping impurities that serve as nucleation sites introduced into the openings;

FIG. 3 shows the structure of FIG. 2 after the sacrificial layer has been removed including the nucleation sites;

FIG. 4 shows an embodiment of an absorber layer with a base layer portion and tubular projections;

FIG. 5 shows the absorber layer with P-N junctions formed therein;

FIGS. 6A-6F are SEM micrographs showing an absorber layer that includes crooked tubular projections; and FIG. 7 illustrates an embodiment of a portion of a solar cell formed according to the disclosure, absorbing sunlight.

DETAILED DESCRIPTION

The disclosure provides a solar cell with an absorber layer with three-dimensional features in the form of tubular projections that are columnar in shape in some embodiments and crooked in shape in other embodiments, and which form part of the absorber layer and extend from a base layer portion of the absorber layer. The disclosure also provides a method for fabricating the absorber layer. The disclosure further provides for harnessing and absorbing sunlight in a solar cell including the absorber layer provided in the disclosure.

Figure 1:
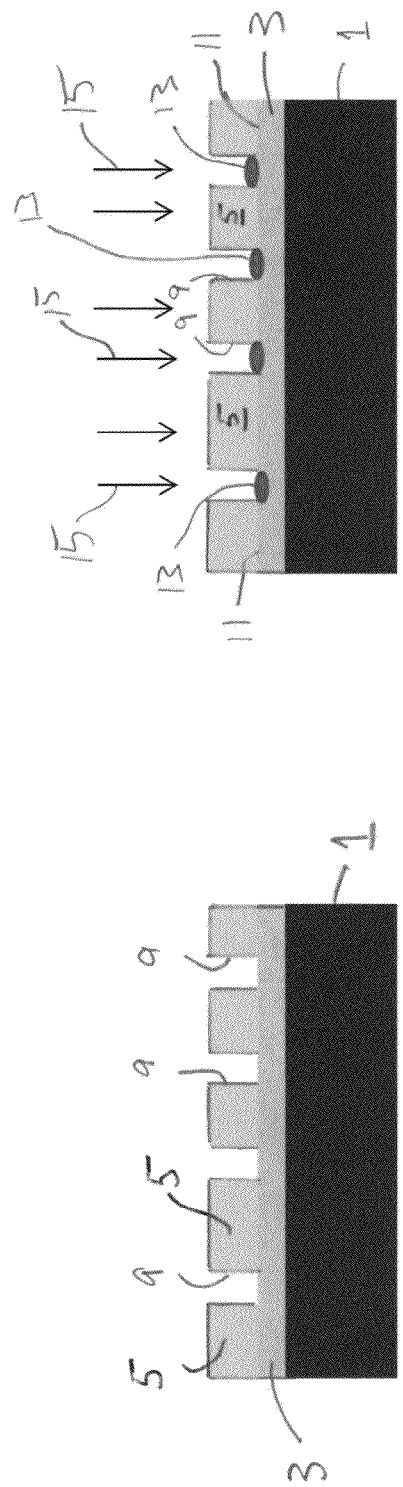
FIGS. 1-5 are cross-sectional views that illustrate a sequence of processing operations used to produce the solar cell absorber layer with tubular projections.

FIG. 1 shows solar cell substrate 1 with material layer 3 over solar cell substrate 1. Solar cell substrate 1 is a glass substrate in one embodiment and in one particular embodiment, solar cell substrate 1 is a soda lime glass substrate but other suitable substrates used in the solar cell manufacturing industry are used in other embodiments. Material layer 3 is an oxide in one embodiment. In other embodiments, material layer 3 is formed of other dielectric materials. In still other embodiments, material layer 3 is formed of other suitable materials used in the solar cell manufacturing industry. Material layer 3 includes various thicknesses in various embodiments. In the illustrated embodiment, material layer 3 is disposed directly on solar cell substrate 1 but in other embodiments, other material layers are interposed between solar cell substrate 1 and material layer 3.

Patterned material layer 5 is formed over material layer 3. Patented material layer 5 is a sacrificial layer. In one embodiment, patterned material layer 5 is photoresist. In other embodiments, pattern material layer 5 is a hard mask. In still other embodiments, patterned material layer is formed of other materials that are different in nature than material layer 3 because patterned material layer 5 is a sacrificial layer and will be subsequently removed in an operation that removes patterned material layer 5 but not material layer 3. Patterned material layer 5 includes openings 9. Various methods such as photolithographic methods and photolithographic methods in conjunction with subsequent etching operations, are used to form openings 9. Openings 9 have various dimensions in various embodiments and may be regularly or irregularly spaced over solar cell substrate 1. Openings 9 are the locations in which dopant impurities will be introduced and the introduced dopant impurities will serve as nucleation sites as will be shown in subsequent figures.

Figure 2:
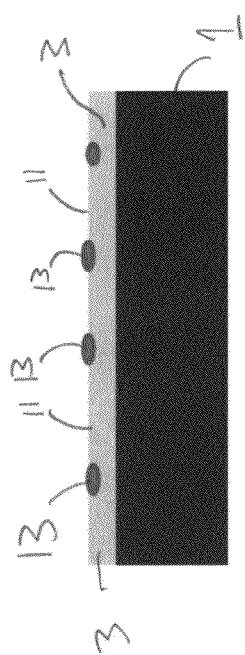

FIG. 2 shows a processing operation step in which nucleation impurities are introduced into the structure shown in FIG. 1. Nucleation impurities 13 are formed on top surface 11 of material layer 3 at the location of openings 9. Arrows 15 indicate the introduction of nucleation impurities 13. In one embodiment, nucleation impurities 13 are introduced by ion implantation and in another embodiment, nucleation impurities 13 are introduced by sputtering. In still other embodiments, nucleation impurities 13 are introduced by chemical vapor deposition (CVD) or other suitable methods for introducing nucleation impurities 13 onto top surface 11 of material layer 3 and through openings 9. Nucleation impurities 13 serve as nucleation sites and have a composition which is distinguished from the composition of material layer 3. In one embodiment, nucleation impurities 13 are formed of aluminum. In one particular embodiment, the aluminum nucleation impurities 13 are introduced by sputtering. In other embodiments, nucleation impurities 13 are copper, cobalt, nickel, chromium or other suitable materials. The materials used as nucleation impurities 13 are materials that serve as good nucleation sites in the formation operation that will be used to form the absorber layer. As such, the materials of nucleation impurities 13 are chosen in conjunction with the deposition operation or other formation operation that will be used to form the absorber layer.

Figure 3:

FIG. 3 shows the structure of FIG. 2 after patterned material layer 5 has been removed. Various wet cleaning, dry cleaning or stripping operations are used in various embodiments to remove patterned material layer 5 to produce the structure shown in FIG. 3. In some embodiments, the removal operation is a selective operation that removes sacrificial patterned material layer 5 while leaving material layer 3 and nucleation impurities 13 substantially intact. FIG. 3 shows solar cell substrate 1 with material layer 3 including top surface 11. Nucleation impurities 13 are disposed at various locations on top surface 11 of material layer 3. The size, density and shape of the nucleation sites formed by nucleation impurities 13 on top surface 11 vary in various embodiments. The density of the nucleation sites formed by nucleation impurities 13 throughout top surface 11 and the distribution of the nucleation sites formed by nucleation impurities 13 on top surface 11 vary in various embodiments.

Figure 4:
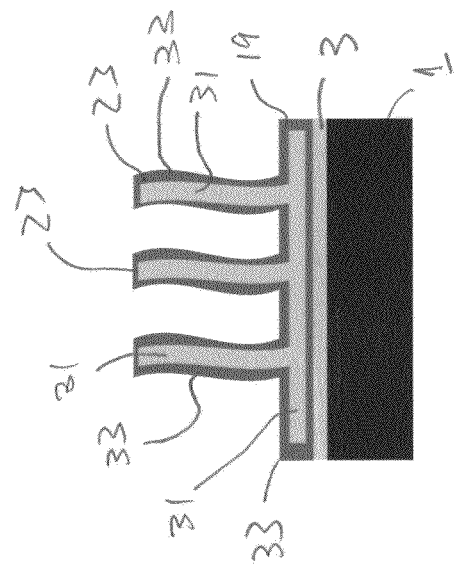

Now turning to FIG. 4, absorber layer 19 is formed over material layer 3. Absorber layer 19 includes base layer portion 21 and tubular projections 23. Base layer portion 21 of absorber layer 19 is a substantially flat layer and includes surface 27. Base layer portion 21 includes various thicknesses in various embodiments and thicknesses may range from about 1000 to about 5000 angstroms, in various embodiments, but other thicknesses are used in other embodiments. Tubular projections 23 are formed at the seed locations, i.e., tubular projections 23 are formed at the location of nucleation impurities 13 shown in the previous figures. In some embodiments, the base portions of tubular projections 23 are orthogonal to base layer portion 21 and in other embodiments, tubular projections 23 extend from base layer portion 21 at various other angles. In one embodiment, absorber layer 19 is formed of polysilicon and is formed using a low pressure chemical vapor deposition (LPCVD) deposition operation. In some embodiments, the silicon is polycrystalline silicon, i.e., polysilicon but other low temperature thin films such as CIGS or other suitable absorber materials, are used in other embodiments. In the LPCVD formation operation, nucleation occurs at the site of the nucleation impurities and produces the tubular projections 23. In the illustrated embodiment, tubular projections 23 are crooked and in other embodiments, tubular projections 23 are more columnar. In some embodiments, tubular projections project generally orthogonally from surface 27 of base layer portion 21 and in other embodiments, tubular projections 23 extend from surface 27 at various oblique angles. By "crooked," it is meant that the tubular projections 23 are non-linear or non-columnar and include curves, bends and junctions and therefore include outer surfaces facing in various different directions. Tubular projections 23 may include heights ranging from about 1 to 15 microns in various embodiments and the tubular portions may include diameters ranging from about 0.2 to about 2 microns in various embodiments, but other heights and diameters are achieved in other embodiments. In the illustrated embodiment, tubular projections 23 are irregularly spaced, i.e., the distance between adjacent tubular projections is not constant, but in other embodiments, tubular projections 23 are regularly spaced. In the illustrated embodiment of FIG. 4, each nucleation site includes a single tubular projection 23 but in other embodiments (see FIGS. 6A-6F) multiple tubular projections emanate from a single nucleation site. Absorber layer 19, which includes base layer portion 21 and tubular projections 23, is therefore three-dimensional in nature.

Absorber layer 19 is formed of silicon in some embodiments and absorber layer 19 is formed of other thin films such as CIGS, silica or other suitable absorber layer materials in other embodiments. In addition to LPCVD, other CVD (chemical vapor deposition) operations such as APCVD (atomic pressure chemical vapor deposition) and PECVD (plasma enhanced chemical vapor deposition) are used to form absorber layer 19 with tubular projections 23 in other embodiments. In still other embodiments, other formation methods are used to form absorber layer 19. The type of deposition operation used to form absorber layer 19 and the conditions of the deposition operation are chosen in conjunction with the underlying materials and the nucleation impurities. In some embodiments, tubular projections 23 of absorber layer 19 consist completely of the deposited material, e.g., polysilicon, used as the absorber layer and in some embodiments, tubular projections 23 also include various amounts of the material used as nucleation impurities 13. In one embodiment in which absorber layer 19 is formed of polycrystalline silicon, and in which aluminum is the nucleation impurity 13, tubular projections 23 are formed of a combination of polycrystalline silicon and aluminum.

In some embodiments, the structure of FIG. 4 is annealed using various annealing methods and conditions.

Figure 5:
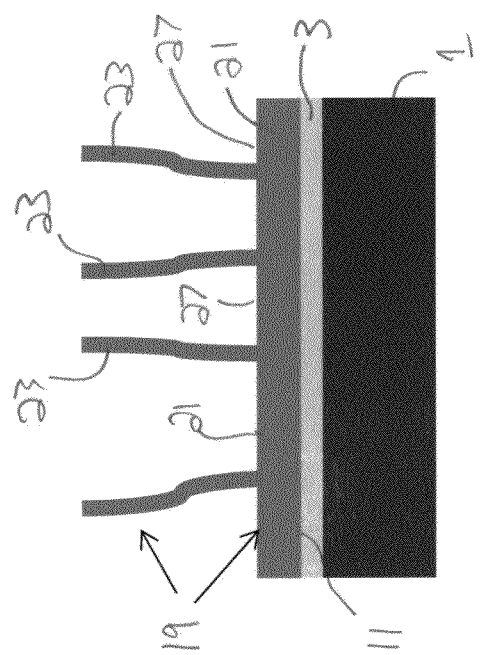

P-N junctions are formed of the absorber layer 19 such as shown in FIG. 5. In FIG. 5, absorber layer 19 including base layer portion 21 and tubular projections 23 is formed of two types of materials: inner material 31 and outer material 33. In one embodiment, inner material 31 is an n-type material with outer material 33 being a p-type material and in another embodiment, inner material layer 31 is a p-type material wherein outer material 33 is an n-type material. Various methods are used to form the P-N junctions.

In one embodiment, the structure shown in FIG. 4 is doped with a p-type dopant such as such as boron. The doping occurs by using a p-type gas in a high temperature chamber to dope absorber layer 19 and form a p-type material, in one embodiment. Afterwards, the now p-type absorber layer 19 is doped with an n-type material such as phosphorous or arsenic to form an N+ outer layer on the p-type absorber layer. In this embodiment, outer material 33 is an N+ material and inner material 31 is a p-type material and the boundary between these two material types forms a P-N junction.

In another embodiment, the structure shown in FIG. 4 is doped with an n-type dopant such as such as phosphorous or arsenic. The doping occurs by using an n-type gas in a high temperature chamber to dope absorber layer 19 to form an n-type material, in one embodiment. Afterwards, the now n-type absorber layer 19 is doped with a p-type material such as boron to form a P+ outer layer on the n-type absorber layer. In this embodiment, outer material 33 is a P+ material and inner material 31 is an N-type material and the boundary between these two material types forms a P-N junction.

FIGS. 6A-6F are each SEM (scanning electron microscope) micrographs showing tubular projections extending from a base layer portion of an absorber layer. FIGS. 6A-6F show just some of the various configurations achievable according to the methods of the disclosure. FIGS. 6B and 6C show multiple tubular projections formed at a single nucleation site and the figures show various different configurations and arrangements that are achievable. In some embodiments, the base layer is substantially planar and multiple tubular projections emanate from a single location on the base layer. The embodiment shown in FIG. 6E includes a tubular projection that is closest to being columnar but is bent to some degree, i.e., crooked. In some embodiments, the tubular projections are substantially straight, i.e. columnar. The embodiments shown in FIGS. 6B and 6D show tubular projections with multiple junctions or inflection points at which the tubular projection changes direction, i.e., bends.

In each of the embodiments, the tubular projections extend upwardly from and are coupled to the underlying portion of the absorber layer which is a substantially level base portion. Each of the embodiments show that the tubular projections are three dimensional in nature and include surfaces facing multiple directions. In some embodiments, the tubular projections also include nodules, knobs or various outgrowths. The embodiments illustrated in FIGS. 6A, 6B and 6D show the tubular projections with nodules. Note nodule 35 on tubular projection 23 shown in FIG. 6D, for example. As such, the tubular projections include surfaces facing various directions and are capable of absorbing sunlight from various directions.

FIG. 7 shows the structure of FIG. 5 in operation absorbing sunlight. FIG. 7 shows absorber layer 19 including base layer portion 21 and tubular projections 23 being used to absorb sunlight. The sunlight is absorbed in the form of photons that are converted to electrical current that is directed to other components or stored according to various methods and using various devices. In the illustrated embodiment, rays 37 from sun 41 strike various portions of absorber layer 19. In some embodiments, the photons from rays 37 are absorbed by the absorber material. In some embodiments, reflected rays 39 are produced. Rays 37 and reflected rays 39 impinge upon various portions of absorber layer 19 at various angles and either rays 37 or reflected rays 39 are absorbed by the base layer portion 21 and/or the tubular projections 31 of absorber layer 19. It should be understood that the configuration shown in FIG. 7 is a simplified version of the various configurations such as were shown in FIGS. 6A-6F. In the embodiments shown in FIGS. 6A-6F, tubular projections 23 are increasingly crooked in nature (e.g., bent, curved, non-linear or non-columnar) and include surfaces facing in various orientations. As such, regardless of the angle of incidence of sunlight, some surfaces of the three dimensional tubular projections shown in FIGS. 6A-6F will be substantially orthogonal to the incoming ray of sunlight and the reflected rays of sunlight, and will absorb the photons and the sunlight and convert the same to electrical current.

It should be understood that the embodiment shown in FIG. 7 is a portion of a solar cell showing the absorber layer and that the embodiment shown in FIG. 7 will have other films formed thereover in some embodiments and will be encapsulated in some embodiments and will be assembled into various solar panel arrangements that are installed and coupled to circuitry that directs the electrical current garnered from the sunlight to further components or stored for future use.

According to one aspect, a solar cell is provided. The solar cell comprises: a solar cell substrate; and an absorber layer disposed over the solar cell substrate, the absorber layer including a base layer and a plurality of tubular projections coupled to and extending above the base layer.

In some embodiments, the base layer is substantially planar and at least some of the tubular projections emanate from a single location on the base layer.

In some embodiments, the absorber layer is silicon and the tubular projections are columnar in configuration and irregularly spaced.

In some embodiments, the absorber layer is silicon and the tubular projections are crooked in configuration.

In some embodiments, the solar cell further comprises a dielectric layer disposed between the solar cell substrate and the absorber layer, and at least some of the tubular projections include nodules extending therefrom.

In some embodiments, the absorber layer is silicon and the tubular base layer and the tubular projections each include P-N junctions therein.

In some embodiments, the tubular projections are irregularly spaced on the base layer and include silicon and aluminum therein.

According to another aspect, a method for forming an absorber layer of a solar cell is provided. The method comprises: providing a solar cell substrate; forming a material layer over the solar cell substrate; forming a pattern in a sacrificial layer formed over the material layer, the pattern including openings; introducing nucleation impurities onto a surface of the material layer through the openings, the nucleation impurities forming nucleation sites on the surface; removing the sacrificial layer; depositing an absorber layer using chemical vapor deposition (CVD) thereby forming a base layer of the absorber material and a plurality of tubular projections formed at the nucleation sites.

In some embodiments, the absorber layer comprises silicon and the chemical vapor deposition (CVD) comprises low pressure chemical vapor deposition (LPCVD).

In some embodiments, the introducing nucleation impurities comprises ion implantation.

In some embodiments, the nucleation impurities comprise one of aluminum, copper, cobalt, nickel, and chromium.

In some embodiments, the introducing nucleation impurities comprises sputtering and the chemical vapor deposition (CVD) comprises low pressure chemical vapor deposition (LPCVD).

In some embodiments, the introducing nucleation impurities comprises chemical vapor deposition (CVD) and at least some of the tubular projections are disposed at a single one of the nucleation sites.

In some embodiments, the method further comprises annealing the absorber material layer and forming P/N junctions in the absorber layering including in the base layer and in the irregular tubular projections.

In some embodiments, the irregular tubular projections are crooked in configuration.

According to another aspect, a method for capturing solar energy is provided. The method comprises: providing a solar cell with an absorber layer disposed over a solar cell substrate, the absorber layer including a base layer and a plurality of tubular projections coupled to and extending above the base layer; and exposing the absorber layer to sunlight such that photons from the sunlight are absorbed in the base layer and in the plurality of tubular projections.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A solar cell comprising:
    a solar cell substrate; and
    an absorber layer disposed over said solar cell substrate, said absorber layer including a base layer and a plurality of tubular projections formed of the same material as said base layer coupled to and extending above said base layer, wherein multiple tubular projections of said plurality of tubular projections emanate from a single nucleation site of said base layer, and wherein at least some of said plurality of tubular projections are crooked in configuration and at least some of said plurality of tubular projections include knobs formed of the same material as an associated tubular projection and projecting outwardly from a side surface of said associated tubular projection, wherein said side surface directly intersects said base layer.

2. The solar cell as in claim 1, wherein said base layer is substantially planar.

3. The solar cell as in claim 1, wherein said absorber layer is formed of silicon and said plurality of tubular projections are columnar in configuration, irregularly spaced and include a lower portion substantially orthogonal to said base layer.

4. The solar cell as in claim 1, wherein said absorber layer is formed of silicon.

5. The solar cell as in claim 1, further comprising a dielectric layer disposed between said solar cell substrate and said absorber layer.

6. The solar cell as in claim 1, wherein said absorber layer is formed of silicon and said base layer and said plurality of tubular projections each include P-N junctions therein.

7. The solar cell as in claim 1, wherein said plurality of tubular projections are irregularly spaced on said base layer and include silicon and aluminum therein.

8. A method for capturing solar energy, said method comprising:
    providing a solar cell with an absorber layer disposed over a solar cell substrate, said absorber layer including a base layer and a plurality of tubular projections directly coupled to and extending above said base layer, wherein at least some of said plurality of tubular projections include knobs formed of the same material as an associated tubular projection and protecting outwardly from a side surface of said associated tubular projection, wherein said side surface directly intersects said base layer; and
    exposing said absorber layer to sunlight such that photons from said sunlight are absorbed in said base layer and in said plurality of tubular projections.

9. The method as in claim 8, wherein said plurality of tubular projections are formed of silicon and are crooked in configuration.

10. The method as in claim 8, wherein multiple tubular projections of said plurality of tubular projections directly contact and intersect said base layer at one site of said base layer.

11. The method as in claim 8, wherein said absorber layer includes P-N junctions in said base layer and in said plurality of tubular projections.

12. The method as in claim 8, wherein said plurality of tubular projections are irregularly spaced on said base layer and are formed of silicon.

13. The method as in claim 8, wherein said plurality of tubular projections include silicon and aluminum therein, at least some of said plurality of tubular projections include lower portions substantially orthogonal to said base layer.

14. The solar cell as in claim 1, wherein said absorber layer comprises CIGS (copper indium gallium selenide).

15. The method as in claim 8, wherein said absorber layer comprises CIGS (copper indium gallium selenide) and said plurality of tubular projections are irregularly spaced.

16. The method as in claim 8, wherein said absorber layer comprises silicon and said providing said solar cell includes providing a material layer over said solar cell substrate, forming nucleation sites on said material layer and forming said absorber layer using chemical vapor deposition such that more than one of said plurality of tubular projections emanate from one of said nucleation sites.

17. The method as in claim 16, wherein said forming nucleation sites comprises sputtering aluminum or copper nucleation impurities onto said material layer.

18. A method for capturing solar energy, said method comprising:
    providing a material layer over a solar cell substrate,
    directly depositing discrete nucleation sites on said material layer,
    forming a silicon absorber layer over said material layer when said material layer is not covered by a continuous layer of material by performing a chemical vapor deposition operation on said material layer with said nucleation sites thereon, said silicon absorber layer including a base layer formed directly on said material layer and a plurality of tubular projections formed of the same material as said base layer coupled to and extending above said base layer at said nucleation sites, at least some of said tubular projections plurality of including side surfaces that intersect said base layer and include knobs extending laterally from said side surfaces; and exposing said absorber layer to sunlight, wherein said directly depositing discrete nucleation sites comprises introducing impurities into openings of a sacrificial layer, then removing said sacrificial layer.

19. The method as in claim 18, wherein said directly depositing discrete nucleation sites comprises sputtering aluminum, copper, cobalt, nickel or chromium nucleation impurities onto said material layer.

20. The method as in claim 18, wherein multiple tubular projections of said plurality of tubular projections directly contact and intersect said base layer at a single one of said nucleation sites.

21. The method as in claim 18, wherein said plurality of tubular projections include tubular projections that intersect said base layer at different angles.

22. The solar cell as in claim 1, wherein said plurality of tubular projections include tubular projections that intersect said base layer at different angles.

23. The method as in claim 8, wherein said plurality of tubular projections include tubular projections that intersect said base layer at different angles.

* * * * *